US010276456B2

(12) United States Patent
Ji et al.

(10) Patent No.: US 10,276,456 B2
(45) Date of Patent: Apr. 30, 2019

(54) ARRAY SUBSTRATE, ITS MANUFACTURING METHOD AND TESTING METHOD, AND DISPLAY DEVICE (71) Applicants: BOE TECHNOLOGY GROUP CO., LTD., Beijing (CN); HEFEI XINSHENG OPTOELECTRONICS TECHNOLOGY CO., LTD., Anhui (CN)

(72) Inventors: Yu Ji, Beijing (CN); Chengye Wu, Beijing (CN); Zhengyun Wu, Beijing (CN); Lei Feng, Beijing (CN); Bei Wang, Beijing (CN); Lei Song, Beijing (CN)

(73) Assignees: BOE TECHNOLOGY GROUP CO., LTD., Beijing (CN); HEFEI XINSHENG OPTOELECTRONICS TECHNOLOGY CO., LTD., Anhui (CN)

(*) Notice: Subject to any disclaimer, the term of this patent is extended or adjusted under 35 U.S.C. 154(b) by 28 days.

(21) Appl. No.: 15/235,945

(22) Filed: Aug. 12, 2016

(65) Prior Publication Data
US 2017/0194219 A1 Jul. 6, 2017

(30) Foreign Application Priority Data
Jan. 4, 2016 (CN) .......................... 2016 1 0006335

(51) Int. Cl.
*H01L 29/45* (2006.01)
*H01L 21/66* (2006.01)
(Continued)

(52) U.S. Cl.
CPC .............. *H01L 22/14* (2013.01); *H01L 22/32* (2013.01); *H01L 22/34* (2013.01); *H01L 27/124* (2013.01); *H01L 29/45* (2013.01); *H01L 29/786* (2013.01)

(58) Field of Classification Search
CPC ....... H01L 22/14; H01L 29/786; H01L 29/45; H01L 22/32; H01L 27/124
See application file for complete search history.

(56) References Cited

U.S. PATENT DOCUMENTS 9,171,869 B1    10/2015  Gao et al.
2009/0153173 A1* 6/2009  Arasawa ................ H01L 22/32
                                                    324/762.02
(Continued)

FOREIGN PATENT DOCUMENTS

CN    104090391 A    10/2014
CN    104362156 A    2/2015
(Continued)

OTHER PUBLICATIONS

First Chinese Office Action regarding Application No. 201610006335.3 dated Feb. 23, 2018. Translation provided by Dragon Intellectual Property Law Firm.

*Primary Examiner* — Selim U Ahmed
(74) *Attorney, Agent, or Firm* — Harness, Dickey & Pierce, P.L.C.

(57) ABSTRACT

The present disclosure provides an array substrate, its manufacturing method and testing method, and a display device. The array substrate includes a (Test Element Group) TEG arranged at a non-display area and including a plurality of to-be-tested elements and a plurality of testing contact electrodes configured to test the to-be-tested elements. Each of the to-be-tested elements is connected to at least two of the testing contact electrodes, and at least one of the testing
(Continued)

contact electrodes is shared by at least two of the to-be-tested elements.

5 Claims, 7 Drawing Sheets

(51) Int. Cl.
  *H01L 27/12* (2006.01)
  *H01L 29/786* (2006.01)

(56) References Cited

U.S. PATENT DOCUMENTS

| | | | |
|---|---|---|---|
| 2010/0066949 A1* | 3/2010 | Utsumi | G02F 1/133528 349/99 |
| 2016/0146880 A1* | 5/2016 | Cai | H01L 22/34 324/750.3 |
| 2016/0293074 A1 | 10/2016 | Yan | |
| 2016/0341789 A1 | 11/2016 | Hu et al. | |

FOREIGN PATENT DOCUMENTS

| | | |
|---|---|---|
| CN | 104505371 A | 4/2015 |
| CN | 104700760 A | 6/2015 |
| CN | 105206601 A | 12/2015 |

\* cited by examiner

Fig.11

ARRAY SUBSTRATE, ITS MANUFACTURING METHOD AND TESTING METHOD, AND DISPLAY DEVICE

CROSS-REFERENCE TO RELATED APPLICATION

The present application claims a priority of the Chinese patent application No. 201610006335.3 filed on Jan. 4, 2016, which is incorporated herein by reference in its entirety.

TECHNICAL FIELD

The present disclosure relates to the testing of a display panel, in particular to an array substrate, its manufacturing method and testing method, and a display device.

BACKGROUND

During the manufacture of a display panel, some Testing Element Groups (TEGs) may be arranged at a non-display area of the display panel, so as to monitor the characteristic values at an active area (AA) of the display panel. These TEGs are configured to test performances of thin film transistors (TFTs) of the display panel as well as resistances of gate metal lines and source-drain (SD) metal lines (each line resistance can indicate thickness uniformity of a metal layer).

Figure 1:
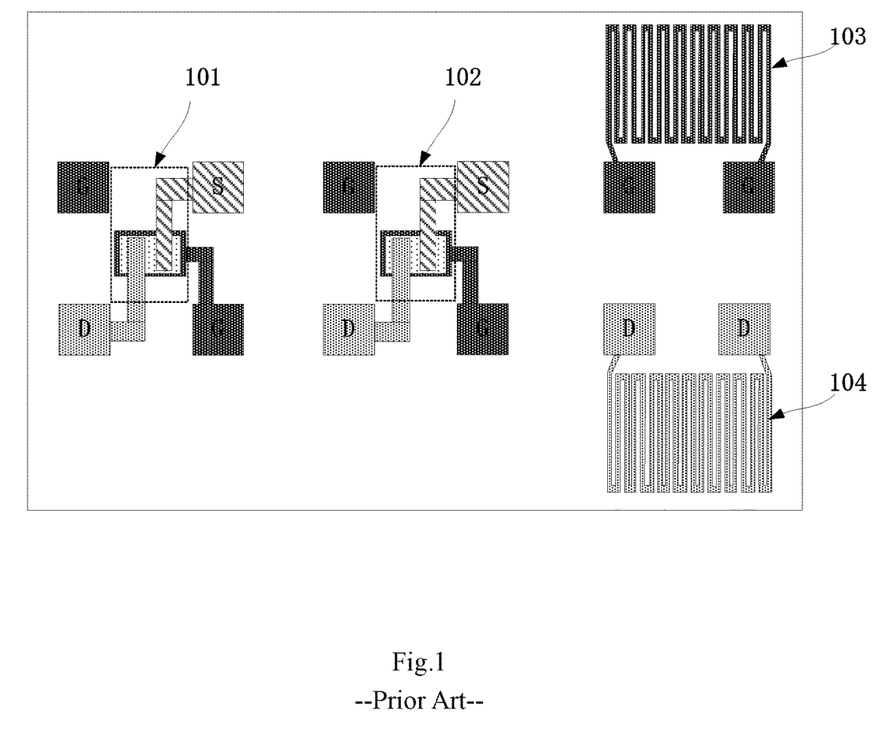
FIG. 1 is a schematic view showing a TEG on an array substrate in the related art.

As shown in FIG. 1, which is a schematic view showing the TEG on an array substrate in the related art, the TEG includes a TFT 101, a TFT 102, a gate metal line 103, an SD metal line 104, and 12 pads (i.e. testing contact electrodes corresponding to S, D and G in FIG. 1). Each TFT corresponds to three testing contact electrodes and each metal line corresponds to two testing contact electrodes, with two testing contact electrodes being unused.

In FIG. 1, each element to be tested (i.e., the TFT, the gate metal line or the SD metal line) corresponds to at least two independent testing contact electrodes. As a result, the testing cost is relatively high, and a large space may be occupied.

SUMMARY

An object of the present disclosure is to provide an array substrate, its manufacturing method and testing method, and a display device, so as to reduce the testing cost as well as the space occupied by the TEGs on the array substrate.

In one aspect, the present disclosure provides in some embodiments an array substrate, including a TEG arranged at a non-display area and including a plurality of to-be-tested elements and a plurality of testing contact electrodes configured to test the to-be-tested elements. Each of the to-be-tested elements is connected to at least two of the testing contact electrodes, and at least one of the testing contact electrodes is shared by at least two of the to-be-tested elements.

Alternatively, the to-be-tested elements include a first TFT and a second TFT, a gate electrode, wherein a gate electrode, a source electrode and a drain electrode of each of the first and second TFTs are connected to the testing contact electrodes respectively, and at least one of the testing contact electrodes is shared by the first TFT and the second TFT.

Alternatively, a first testing contact electrode is shared by the gate electrodes of the first and second TFTs.

Alternatively, the first testing contact electrode is arranged at a layer, and made of a material, identical to the gate electrodes of the first and second TFTs.

Alternatively, a second testing contact electrode is shared by one of the source electrode and the drain electrode of the first TFT and one of the source electrode and the drain electrode of the second TFT.

Alternatively, the second testing contact electrode is arranged at a layer, and made of a material, identical to an indium tin oxide (ITO) electrode of the array substrate.

Alternatively, the to-be-tested elements include a gate metal line and a gate metal layer-ITO electrode contact resistor, and a third testing contact electrode is shared by the gate metal line and the gate metal layer-ITO electrode contact resistor.

Alternatively, the third testing contact electrode is arranged at a layer, and made of a material, identical to the gate metal line.

Alternatively, the to-be-tested elements include an SD metal line and an SD metal layer-ITO electrode contact resistor, and a fourth testing contact electrode is shared by the SD metal line and the SD metal layer-ITO electrode contact resistor.

Alternatively, the fourth testing contact electrode is arranged at a layer, and made of a material, identical to the SD metal line.

Alternatively, the to-be-tested elements include a gate metal layer-ITO electrode contact resistor and an SD metal layer-ITO electrode contact resistor, and a fifth testing contact electrode is shared by the gate metal layer-ITO electrode contact resistor and the SD metal layer-ITO electrode contact resistor.

Alternatively, the fifth testing contact electrode is arranged at a layer, and made of a material, identical to the ITO electrode of the array substrate.

Alternatively, the to-be-tested elements include a first TFT, a second TFT, a gate metal line, an SD metal line, a gate metal layer-ITO electrode contact resistor and an SD metal layer-ITO electrode contact resistor, and nine testing contact electrodes are used by the to-be-tested elements. A first testing contact electrode is shared by a gate electrode of the first TFT and a gate electrode of the second TFT, a second testing contact electrode is shared by a source electrode of the first TFT and a source electrode of the second TFT, a third testing contact electrode is shared by the gate metal line and the gate metal layer-ITO electrode contact resistor, a fourth testing contact electrode is shared by the SD metal line and SD metal layer-ITO electrode contact resistor, and a fifth testing contact electrode is shared by the gate metal layer-ITO electrode contact resistor and the SD metal layer-ITO electrode contact resistor. The gate electrode of the first TFT is connected to the first testing contact electrode, the source electrode of the first TFT is connected to the second testing contact electrode, and a drain electrode of the first TFT is connected to a sixth testing contact electrode. The gate electrode of the second TFT is connected to the first testing contact electrode, the source electrode of the second TFT is connected to the second testing contact electrode, and a drain electrode of the second TFT is connected to a seventh testing contact electrode. One end of the gate metal line is connected to the fourth testing contact electrode, and the other end of the gate metal line is connected to an eighth testing contact electrode. One end of the SD metal line is connected to the third testing contact electrode, and the other end of the SD metal line is connected to a ninth testing contact electrode. The gate metal layer-ITO electrode contact resistor is connected to the fifth testing contact electrode and the fourth testing contact electrode, and the SD metal layer-ITO electrode contact resistor is connected to the fifth testing contact electrode and the third testing contact electrode.

Alternatively, the TEG includes M testing contact electrodes arranged in an N*N array with a row interval being identical to a column interval, where M=N*N, and M and N are both positive integers.

In another aspect, the present disclosure provides in some embodiments a display device including the array substrate.

In yet another aspect, the present disclosure provides in some embodiments a method for manufacturing the above-mentioned array substrate.

Alternatively, the method includes steps of: providing a base substrate; forming a pattern of a gate metal layer on the base substrate, the pattern of the gate metal layer including a gate electrode of a first TFT, a gate electrode of a second TFT, a gate metal line and three testing contact electrodes for the gate metal layer; forming a gate insulation layer; forming a pattern of a semiconductor layer; forming a pattern of an SD metal layer, the pattern of the SD metal layer including a drain electrode of the first TFT, a drain electrode of the second TFT, an SD metal line, and four testing contact electrodes for the SD metal layer; forming a passivation layer and via-holes in the passivation layer; and forming a pattern of an ITO electrode layer, the pattern of the ITO electrode layer including a source electrode of the first TFT, a source electrode of the second TFT, and two testing contact electrodes for the ITO electrode layer, one end of one of the testing contact electrodes for the ITO electrode layer being connected to one of the testing contact electrodes for the gate metal layer through one of the via-holes in the passivation layer, the other end of the one of the testing contact electrodes for the ITO electrode layer being connected to one of the testing contact electrodes for the SD metal layer through another one of the via-holes in the passivation layer, and the other one of the testing contact electrodes for the ITO electrode layer being connected to the source electrode of the first TFT and the source electrode of the second TFT.

In still yet another aspect, the present disclosure provides in some embodiments a method for testing the above-mentioned array substrate.

Alternatively, the to-be-tested elements include a first TFT, a second TFT, a gate metal line, an SD metal line, a gate metal layer-ITO electrode contact resistor and an SD metal layer-ITO electrode contact resistor, and nine testing contact electrodes are used by the to-be-tested elements. A first testing contact electrode is shared by a gate electrode of the first TFT and a gate electrode of the second TFT, a second testing contact electrode is shared by a source electrode of the first TFT and a source electrode of the second TFT, a third testing contact electrode is shared by the gate metal line and the gate metal layer-ITO electrode contact resistor, a fourth testing contact electrode is shared by the SD metal line and SD metal layer-ITO electrode contact resistor, and a fifth testing contact electrode is shared by the gate metal layer-ITO electrode contact resistor and the SD metal layer-ITO electrode contact resistor. The gate electrode of the first TFT is connected to the first testing contact electrode, the source electrode of the first TFT is connected to the second testing contact electrode, and a drain electrode of the first TFT is connected to a sixth testing contact electrode. The gate electrode of the second TFT is connected to the first testing contact electrode, the source electrode of the second TFT is connected to the second testing contact electrode, and a drain electrode of the second TFT is connected to a seventh testing contact electrode. One end of the gate metal line is connected to the fourth testing contact electrode, and the other end of the gate metal line is connected to an eighth testing contact electrode. One end of the SD metal line is connected to the third testing contact electrode, and the other end of the SD metal line is connected to a ninth testing contact electrode. The gate metal layer-ITO electrode contact resistor is connected to the fifth testing contact electrode and the fourth testing contact electrode, and the SD metal layer-ITO electrode contact resistor is connected to the fifth testing contact electrode and the third testing contact electrode. The testing method includes steps of: applying a scanning signal to the first testing contact electrode, enabling the second testing contact electrode to be grounded, and applying a voltage to the sixth testing contact electrode and the seventh testing contact electrode, so as to test performances of the first TFT and the second TFT; enabling the fifth testing contact electrode to be grounded, and applying a voltage to the third testing contact electrode and the fourth testing contact electrode, so as to test the gate metal layer-ITO electrode contact resistor and the SD metal layer-ITO electrode contact resistor; and enabling the third testing contact electrode and the fourth testing contact electrode to be grounded, and applying a voltage to the ninth testing contact electrode and the eighth testing contact electrode, so as to test line resistances of the gate metal line and the SD metal line.

Alternatively, the nine testing contact electrodes are arranged in a 3*3 array with a row interval being identical to a column interval, and testing pins of a testing device are arranged in a manner identical to the nine testing contact electrodes.

According to the embodiments of the present disclosure, at least one of the testing contact electrodes is shared by at least two of the to-be-tested elements of the TEG on the array substrate. As a result, it is able to reduce the number of the testing contact electrodes, thereby to reduce the testing cost as well as the space occupied by the TEG.

BRIEF DESCRIPTION OF THE DRAWINGS

In order to illustrate the technical solutions of the present disclosure or the related art in a clearer manner, the drawings desired for the present disclosure or the related art will be described hereinafter briefly. Obviously, the following drawings merely relate to some embodiments of the present disclosure, and based on these drawings, a person skilled in the art may obtain the other drawings without any creative effort.

DETAILED DESCRIPTION OF THE EMBODIMENTS

In order to make the objects, the technical solutions and the advantages of the present disclosure more apparent, the present disclosure will be described hereinafter in a clear and complete manner in conjunction with the drawings and embodiments. Obviously, the following embodiments merely relate to a part of, rather than all of, the embodiments of the present disclosure, and based on these embodiments, a person skilled in the art may, without any creative effort, obtain the other embodiments, which also fall within the scope of the present disclosure.

Unless otherwise defined, any technical or scientific term used herein shall have the common meaning understood by a person of ordinary skills. Such words as "first" and "second" used in the specification and claims are merely used to differentiate different components rather than to represent any order, number or importance. Similarly, such words as "one" or "a" are merely used to represent the existence of at least one member, rather than to limit the number thereof. Such words as "connect" or "connected to" may include electrical connection, direct or indirect, rather than to be limited to physical or mechanical connection. Such words as "on", "under", "left" and "right" are merely used to represent relative position relationship, and when an absolute position of the object is changed, the relative position relationship will be changed too.

In order to reduce the testing cost as well as the space occupied by a TEG, the present disclosure provides in some embodiments an array substrate which includes a TEG arranged at a non-display area of the array substrate. The TEG includes a plurality of to-be-tested elements and a plurality of testing contact electrodes configured to test the to-be-tested elements. Each of the to-be-tested elements is connected to at least two of the testing contact electrodes, and at least one of the testing contact electrodes is shared by at least two of the to-be-tested elements.

Because at least one of the testing contact electrodes is shared by at least two of the to-be-tested elements, it is able to reduce the number of the testing contact electrodes, thereby to reduce the testing cost as well as the space occupied by the TEG.

The to-be-tested elements may include TFTs.

In some embodiments of the present disclosure, the to-be-tested elements may include a first TFT and a second TFT, a gate electrode, a source electrode and a drain electrode of each of the first and second TFTs are connected to the testing contact electrodes respectively, and at least one of the testing contact electrodes is shared by the first TFT and the second TFT.

Alternatively, a first testing contact electrode may be shared by the gate electrodes of the first and second TFTs.

Alternatively, the first testing contact electrode is arranged at a layer, and made of a material, identical to the gate electrodes of the first and second TFTs through a single patterning process, so as to reduce the manufacture cost.

In the embodiments of the present disclosure, a second testing contact electrode may be shared by one of the source electrode and the drain electrode of the first TFT and one of the source electrode and the drain electrode of the second TFT. In other words, the second testing contact electrode may be shared by the source electrodes of the first and second TFTs, or by the source electrode of the first TFT and the drain electrode of the second TFT, or by the drain electrode of the first TFT and the source electrode of the second TFT, or by the drain electrodes of the first and second TFTs.

Alternatively, the second testing contact electrode may be arranged at a layer, and made of a material, identical to the source electrodes and the drain electrodes of the first and second TFTs through a single patterning process, so as to reduce the manufacture cost.

In addition, the second testing contact electrode may also be arranged at a layer, and made of a material, identical to an ITO electrode of the array substrate through a single patterning process, so as to reduce the manufacture cost.

Figure 2:
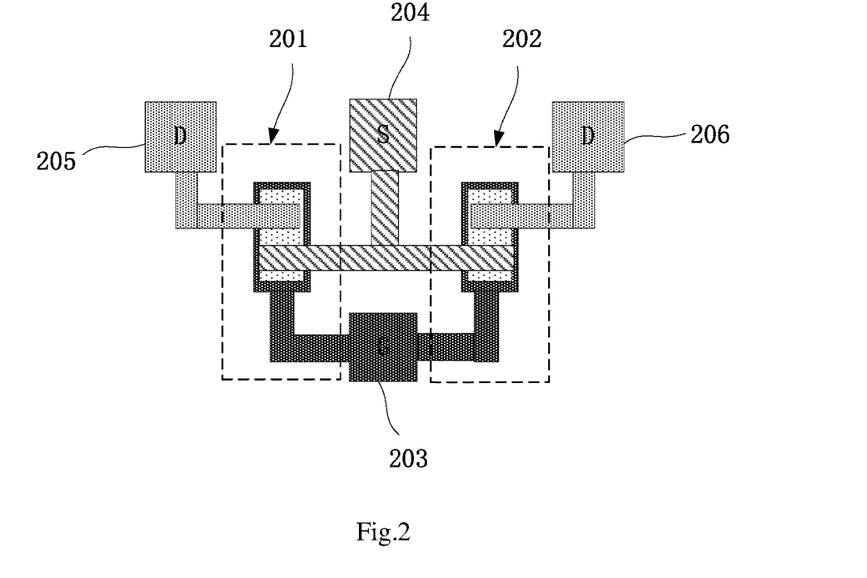
FIG. 2 is a schematic view showing a TEG on an array substrate according to some embodiments of the present disclosure.

Referring to FIG. 2, which is a schematic view showing the TEG on the array substrate, the array substrate includes a TEG arranged at a non-display area of the array substrate, and the TEG includes a plurality of to-be-tested elements and a plurality of testing contact electrodes configured to test the to-be-tested elements. The to-be-tested elements include a first TFT 201, a second TFT 202, a first testing contact electrode 203, a second testing contact electrode 204, a sixth testing contact electrode 205 and a seventh testing contact electrode 206.

The first testing contact electrode 203 is arranged at a layer, and made of a material, identical to gate electrodes of the first TFT 201 and the second TFT 202 through a single patterning process. The second testing contact electrode 204 is arranged at a layer, and made of a material, identical to an ITO electrode of the array substrate through a single patterning process. The sixth testing contact electrode 205 and the seventh testing contact electrode 206 are arranged at a layer, and made of a material, identical to an SD metal layer (i.e., the source electrodes and the drain electrodes of the first TFT 201 and the second TFT 202) through a single patterning process.

The gate electrode of the first TFT 201 is connected to the first testing contact electrode 203, the source electrode thereof is connected to the second testing contact electrode 204, and the drain electrode thereof is connected to the sixth testing contact electrode 206. The gate electrode of the second TFT 202 is connected to first testing contact electrode 203, the source electrode thereof is connected to the second testing contact electrode 204, and the drain electrode thereof is connected to the seventh testing contact electrode 206.

Hence, the first testing contact electrode 203 is shared by the gate electrodes of the first TFT 201 and the second TFT 202, and the second testing contact electrode 204 is shared by the source electrodes of the first TFT 201 and the second TFT 202.

In other words, in the embodiments of the present disclosure, the two TFTs may be tested through four testing contact electrodes, as compared with the related art where two TFTs may be tested through six testing contact electrodes. As a result, it is able to reduce the number of the testing contact electrodes, thereby to reduce the testing cost as well as the space occupied by the TEG.

In some embodiments of the present disclosure, the to-be-tested elements may include a gate metal line and a gate metal layer-ITO electrode contact resistor, and a third testing contact electrode is shared by the gate metal line and the gate metal layer-ITO electrode contact resistor.

The gate metal line is arranged at a layer, and made of a material, identical to the gate electrode of the TFT on the array substrate through a single patterning process (i.e., the gate metal line is located at the gate metal layer). A resistance of the gate metal line may be used to indicate the thickness uniformity of the metal layer.

Usually, the gate metal line may be, but not limited to, a folded line of an arcuate shape. The gate metal layer-ITO electrode contact resistor refers to a resistor at a position where the gate metal layer is connected to an ITO electrode layer through a via-hole, and it may be used to reflect an entire state of the via-hole. An abnormality in charging the ITO electrode may occur due to the abnormal via-hole.

Alternatively, the third testing contact electrode may be arranged at a layer, and made of a material, identical to the gate metal line through a single patterning process (i.e., the third testing contact electrode is located at the gate metal layer), so as to reduce the manufacture cost.

In some embodiments of the present disclosure, the to-be-tested elements may include an SD metal line and an SD metal layer-ITO electrode contact resistor, and a fourth testing contact electrode is shared by the SD metal line and the SD metal layer-ITO electrode contact resistor.

The SD metal line is located at an SD metal layer (i.e. a data line layer), and a resistance of the SD metal line may be used to indicate the thickness uniformity of the metal layer. Usually, the SD metal line may be, but not limited to, a folded line of an arcuate shape. The SD metal layer-ITO electrode contacting resistor refers to a resistor at a position where the SD metal layer is connected to the ITO electrode layer through a via-hole, and the SD metal layer-ITO electrode contacting resistor may be used to reflect an entire state of the via-hole. An abnormality in charging the ITO electrode may occur due to the abnormal via-hole.

Alternatively, the fourth testing contact electrode may be arranged at a layer, and made of a material, identical to the SD metal line through a single patterning process (i.e., the fourth testing contact electrode is arranged at the SD metal layer), so as to reduce the manufacture cost.

In some embodiments of the present disclosure, the to-be-tested elements may include a gate metal layer-ITO electrode contact resistor and an SD metal layer-ITO electrode contact resistor, and a fifth testing contact electrode is shared by the gate metal layer-ITO electrode contact resistor and the SD metal layer-ITO electrode contact resistor.

Alternatively, the fifth testing contact electrode may be arranged at a layer, and made of a material, identical to the ITO electrode of the array substrate through a single patterning process, so as to reduce the manufacture cost.

For the array substrate, it is very important to test the gate metal layer-ITO electrode contact resistor and the SD metal layer-ITO electrode contact resistor. Especially for the array substrate including the gate metal layer and the SD metal layer made of Cu (copper), such defects as thin dark lines (i.e., the slightly dark lines on a screen in the case that the screen is lighted up) may easily occur, and at this time, it is particularly required to test the gate metal layer-ITO electrode contact resistor and the SD metal layer-ITO electrode contact resistor.

Figure 3:
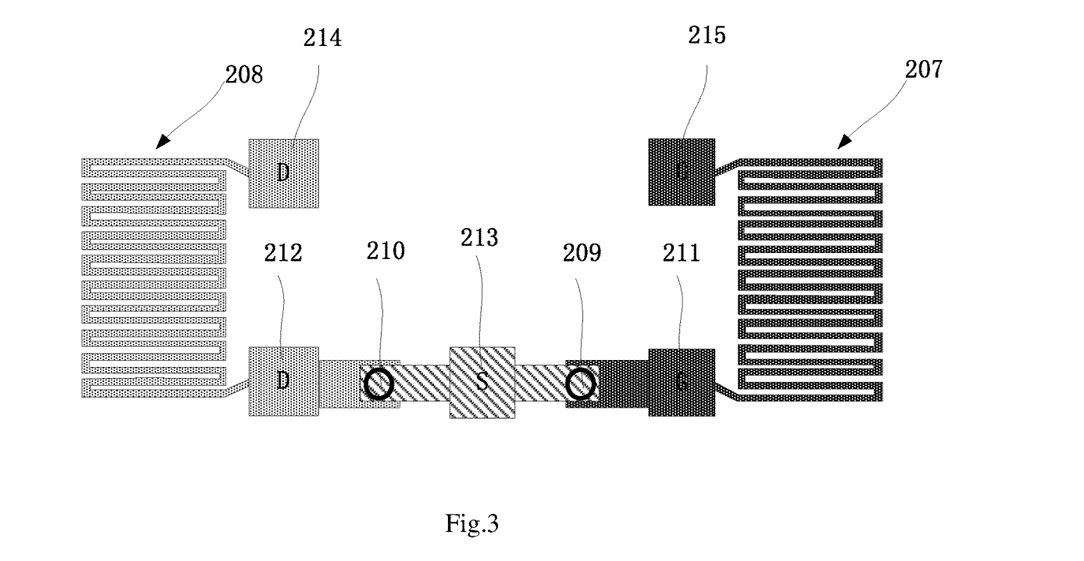
FIG. 3 is another schematic view showing the TEG on the array substrate according to some embodiments of the present disclosure.

Referring to FIG. 3, which is another schematic view showing the TEG on the array substrate, the array substrate includes a TEG arranged at a non-display area of the array substrate, and the TEG includes a plurality of to-be-tested elements and a plurality of testing contact electrodes configured to test the to-be-tested elements. The to-be-tested elements include a gate metal line 207, an SD metal line 208, a gate metal layer-ITO electrode contact resistor 209, an SD metal layer-ITO electrode contact resistor 210, a third testing contact electrode 211, a fourth testing contact electrode 212, a fifth testing contact electrode 213, an eighth testing contact electrode 214 and a ninth testing contact electrode 215.

The second testing contact electrodes 211 and the ninth testing contact electrodes 215 are arranged at a layer, and made of a material, identical to the gate metal line 207 through a single patterning process. The fourth testing contact electrode 212 and the eighth testing contact electrode 214 are arranged at a layer, and made of a material, identical to the SD metal line 208 through a single patterning process. The fifth testing contact electrode 213 is arranged at a layer, and made of a material, identical to the gate metal layer-ITO electrode contact resistor 209 and the SD metal layer-ITO electrode contact resistor 210 through a single patterning process.

One end of the gate metal line 207 is connected to the ninth testing contact electrode 215, and the other end thereof is connected to the third testing contact electrode 211. One end of the SD metal line 208 is connected to the fourth testing contact electrode 212, and the other end thereof is connected to the eighth testing contact electrode 214. One end of the gate metal layer-ITO electrode contact resistor 209 is connected to the fifth testing contact electrode 213, and the other end thereof is connected to the third testing contact electrode 211. One end of the SD metal layer-ITO electrode contact resistor 210 is connected to the fourth testing contact electrode 212, and the other end thereof is connected to the fifth testing contact electrode 213.

Hence, the third testing contact electrode 211 may be shared by the gate metal line 207 and the gate metal layer-ITO electrode contact resistor 209, the fourth testing contact electrode 212 may be shared by the SD metal line 208 and the SD metal layer-ITO electrode contact resistor 210, and the fifth testing contact electrode 213 may be shared by the gate metal layer-ITO electrode contact resistor 209 and the SD metal layer-ITO electrode contact resistor 210.

In other words, in the embodiments of the present disclosure, the gate metal line, the SD metal line, the gate metal layer-ITO electrode contact resistor and the SD metal layer-ITO electrode contact resistor may be tested through five testing contact electrodes, as compared with the related art where seven testing contact electrodes need to be used. As a result, it is able to reduce the number of the testing contact electrodes, thereby to reduce the testing cost and the space occupied by the TEG. In addition, different from the related art, it is also able to test the gate metal layer-ITO electrode contact resistor and the SD metal layer-ITO electrode contact resistor in the embodiments of the present disclosure.

Figure 4:
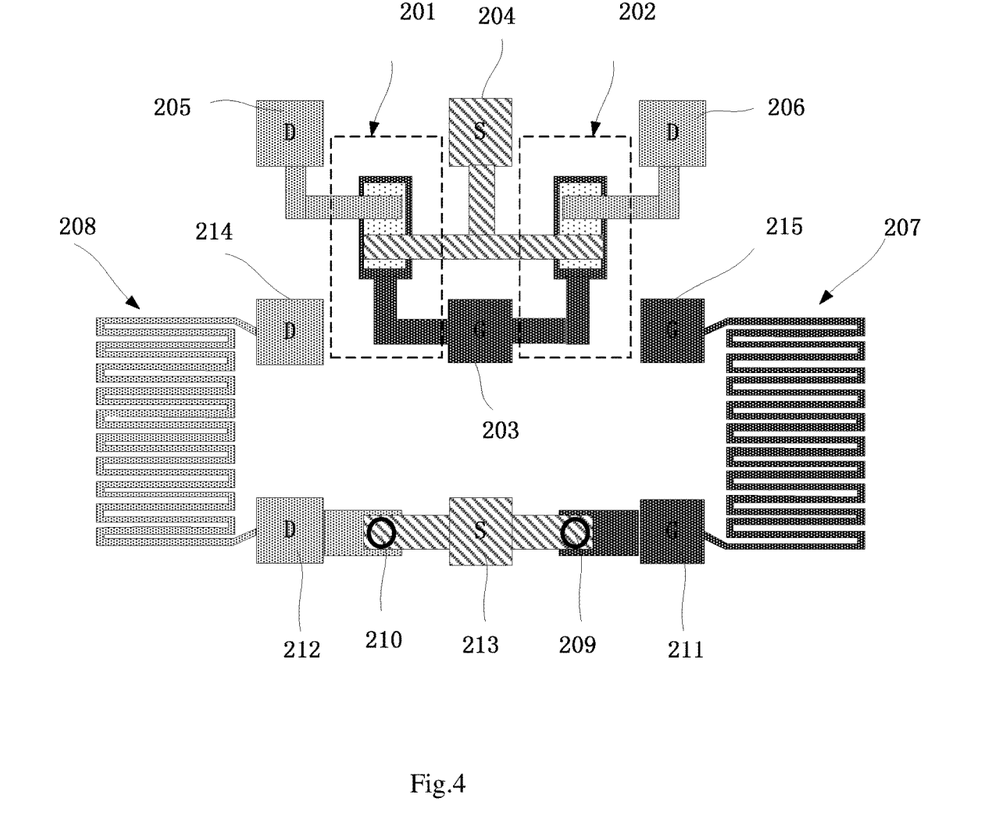
FIG. 4 is yet another schematic view showing the TEG on the array substrate according to some embodiments of the present disclosure.

Referring to FIG. 4, which is a schematic view showing the TEG on the array substrate, the TEG includes a plurality of to-be-tested elements and nine testing contact electrodes for testing the to-be-tested elements. The to-be-tested elements include the first TFT 201, the second TFT 202, the gate metal line 207, the SD metal line 208, the gate metal layer-ITO electrode contact resistor 209 and the SD metal layer-ITO electrode contact resistor 210.

The first testing contact electrode 203 is arranged at a layer, and made of a material, identical to the gate electrodes of the first TFT 201 and the second TFT 202 through a single patterning process. The second testing contact electrode 204 is arranged at a layer, and made of a material, identical to the ITO electrode of the array substrate through a single patterning process. The sixth testing contact electrode 205 and the seventh testing contact electrode 206 are arranged at a layer, and made of a material, identical to the SD metal layer (i.e., the source electrodes and the drain electrodes of the first TFT 201 and the second TFT 202) through a single patterning process.

The gate electrode of the first TFT 201 is connected to the first testing contact electrode 203, the source electrode thereof is connected to the second testing contact electrode 204, and the drain electrode thereof is connected to the sixth testing contact electrode 206. The gate electrode of the second TFT 202 is connected to the first testing contact electrode 203, the source electrode thereof is connected to the second testing contact electrode 204, and the drain electrode thereof is connected to the seventh testing contact electrode 206.

Hence, the first testing contact electrode 203 may be shared by the gate electrodes of the first TFT 201 and the second TFT 202, and the second testing contact electrode 204 may be shared by the source electrodes of the first TFT 201 and the second TFT 202.

The third testing contact electrode 211 and the ninth testing contact electrode 215 are arranged at a layer, and made of a material, identical to the gate metal line 207 through a single patterning process. The fourth testing contact electrode 212 and the eighth testing contact electrode 214 are arranged at a layer, and made of a material, identical to the SD metal line 208 through a single patterning process. The fifth testing contact electrode 213 is arranged at a layer, and made of a material, identical to the gate metal layer-ITO electrode contact electrode 209 and the SD metal layer-ITO electrode contact electrode 210 through a single patterning process.

One end of the gate metal line 207 is connected to the ninth testing contact electrode 215, and the other end thereof is connected to the third testing contact electrode 211. One end of the SD metal line 208 is connected to the fourth testing contact electrode 212, and the other end thereof is connected to the eighth testing contact electrode 214. One end of the gate metal layer-ITO electrode contact resistor 209 is connected to the fifth testing contact electrode 213, and the other end thereof is connected to the third testing contact electrode 211. One end of the SD metal layer-ITO electrode contact resistor 210 is connected to the fourth testing contact electrode 212, and the other end thereof is connected to the fifth testing contact electrode 213.

Hence, the third testing contact electrode 211 may be shared by the gate metal line 207 and the gate metal layer-ITO electrode contact resistor 209, the fourth testing contact electrode 212 may be shared by the SD metal line 208 and the SD metal layer-ITO electrode contact resistor 210, and the fifth testing contact electrode 213 may be shared by the gate metal layer-ITO electrode contact resistor 209 and the SD metal layer-ITO electrode contact resistor 210.

For the TEG in the related art in FIG. 1 where no testing contact electrode is shared, fourteen testing contact electrodes need to be used, so as to test the first TFT, the second TFT, a resistance of the gate metal line, a resistance of the SD metal line, the gate metal layer-ITO electrode contact resistor and the SD metal layer-ITO electrode contact resistor. However, in the embodiments of the present disclosure, merely nine testing contact electrodes need to be used. As a result, it is able to effectively reduce the number of the testing contact electrodes, thereby to reduce the testing cost as well as the space occupied by the TEG. In addition, it is also able to test the gate metal layer-ITO electrode contact resistor and the SD metal layer-ITO electrode contact resistor.

Figure 5:
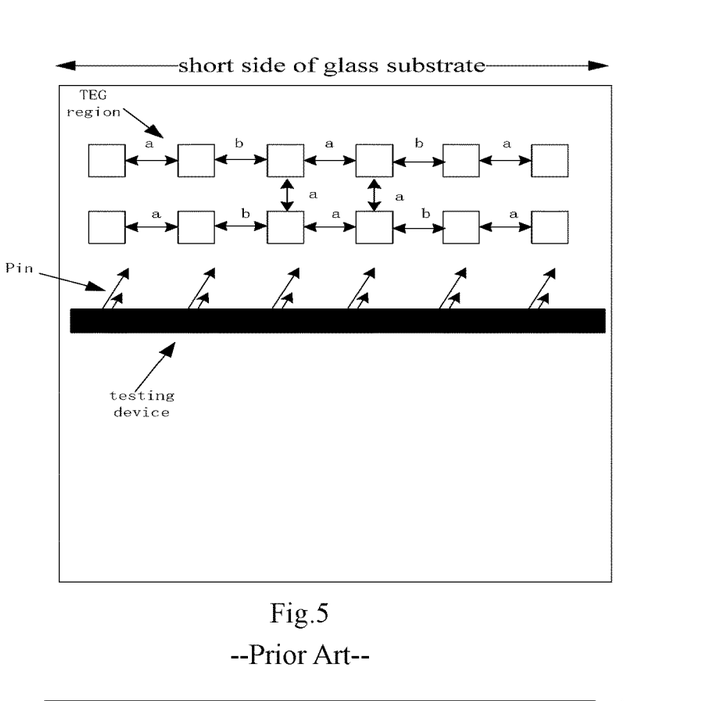
FIG. 5 is a schematic view showing an arrangement mode for the TEG on the array substrate in the related art.
Figure 6:
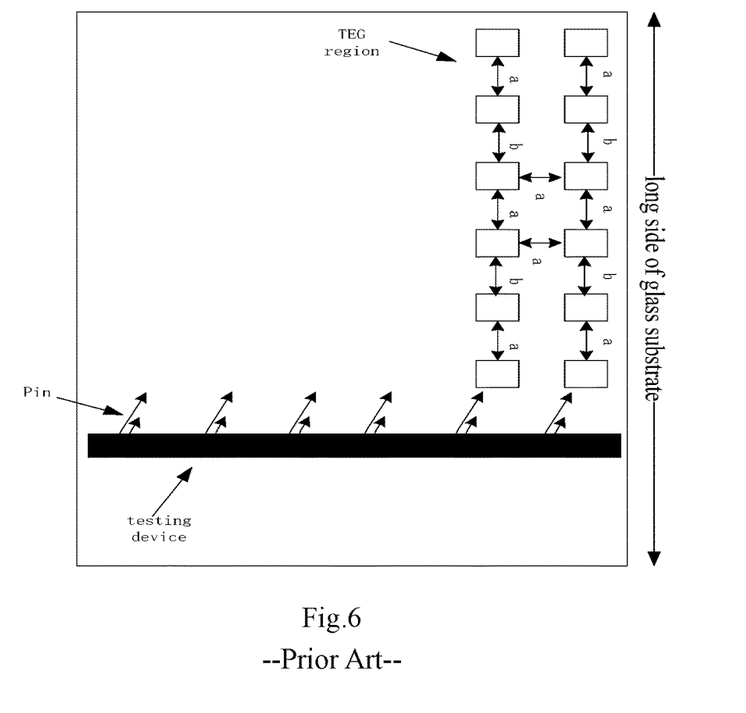
FIG. 6 is another schematic view showing the arrangement mode for the TEG on the array substrate in the related art.

Referring to FIGS. 1, 5 and 6, the testing contact electrodes of the TEG in the related art are arranged in a rectangle form in two rows. In FIGS. 5 and 6, "a" and "b" represent intervals between the testing contact electrodes. In the embodiments of the present disclosure, a=200 μm and b=400 μm. In addition, the testing contact electrodes are of an identical size, i.e., a 200 μm*200 μm square.

The testing contact electrodes may be arranged on a base substrate (glass substrate) in one of two modes, one is that a long side of the formed rectangle is arranged parallel to a short side of the base substrate (as shown in FIG. 5), and the other is that a long side of the formed rectangle is arranged parallel to a long side of the base substrate (as shown in FIG. 6). In addition, as shown in FIGS. 5 and 6, the number of testing pins of a testing device for testing the TEG and an arrangement mode thereof are identical to those of the testing contact electrodes. In other words, the testing pins may be arranged in a rectangle form in two rows, and a long side of the formed rectangle may be arranged parallel to the short side of the base substrate.

In the case of testing the array substrate in FIG. 5, the testing pins of the testing device may be connected to the testing contact electrodes respectively.

In the case of testing the array substrate in FIG. 6, it needs to rotate a stage for carrying the array substrate by 90° or −90°, so as to enable the testing contact electrodes to be aligned with the testing pins, thereby to perform the testing normally. In addition, after the testing, it is required to rotate the stage to its initial position, so as to pick out the array substrate. As a result, a large amount of tact time needs to be taken, and the testing efficiency is relatively low.

In order to overcome these defects, the TEG in the embodiments of the present disclosure may include M testing contact electrodes of an identical size. The M testing contact electrodes are arranged in an N*N array with a row interval being identical to a column interval, where M=N*N, and M and N are both positive integers. In other words, the testing contact electrodes may be arranged in a square form, with one side of the square being parallel to the short side of the base substrate and the other side being parallel to the long side of the base substrate.

In addition, the testing pins of the testing device may also be arranged in an N*N array, so that the stage does not need to be rotated during the testing. As a result, it is able to reduce the tact time and improve the testing efficiency.

Figure 7:
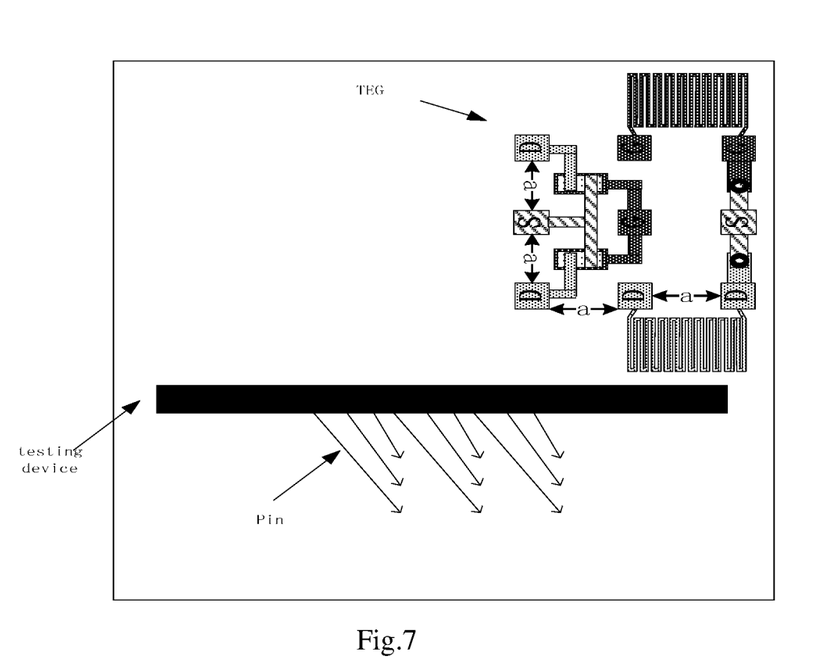
FIG. 7 is a schematic view showing an arrangement mode for the TEG on the array substrate according to some embodiments of the present disclosure.
Figure 8:
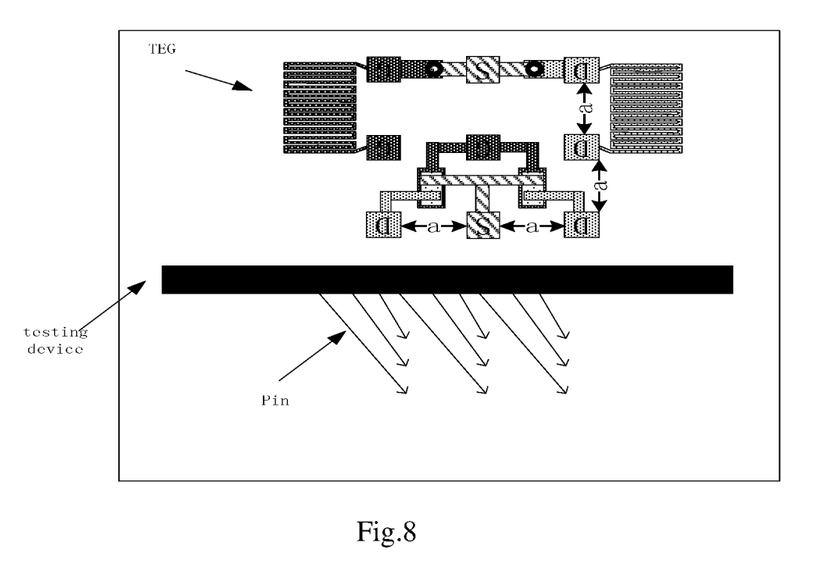
FIG. 8 is another schematic view showing the arrangement mode for the TEG on the array substrate according to some embodiments of the present disclosure.

Referring to FIG. 4, the TEG includes nine testing contact electrodes of an identical size and an identical shape, i.e., a square shape (of course, in some other embodiments, the testing contact electrode may also be of a circular shape). The nine testing contact electrodes are arranged in a 3*3 array, with a row interval and a column interval being both a. Referring further to FIGS. 7 and 8, during the testing, it is unnecessary to rotate the stage in regardless of the arrangement mode of the TEG. As a result, it is able to reduce the tact time and improve the testing efficiency. In addition, the testing pins of the testing device are also arranged in a 3*3 array.

The present disclosure further provides in some embodiments a display device including the above-mentioned array substrate.

The present disclosure further provides in some embodiments a method for manufacturing the above-mentioned array substrate.

In an alternative embodiment, the manufacturing method may include: Step S11 of providing a base substrate; Step S12 of forming a pattern of a gate metal layer on the base substrate, the pattern of the gate metal layer including a gate electrode of a first TFT, a gate electrode of a second TFT, a gate metal line and three testing contact electrodes for the gate metal layer; Step S13 of forming a gate insulation layer; Step S14 of forming a pattern of a semiconductor layer; Step S15 of forming a pattern of an SD metal layer, the pattern of the SD metal layer including a drain electrode of the first TFT, a drain electrode of the second TFT, an SD metal line, and four testing contact electrodes for the SD metal layer; Step S16 of forming a passivation layer and via-holes in the passivation layer; and Step S17 of forming a pattern of an ITO electrode layer, the pattern of the ITO electrode layer including a source electrode of the first TFT, a source electrode of the second TFT, and two testing contact electrodes for the ITO electrode layer, one end of one of the testing contact electrodes for the ITO electrode layer being connected to one of the testing contact electrodes for the gate metal layer through one of the via-holes in the passivation layer, the other end of the one of the testing contact electrodes for the ITO electrode layer being connected to one of the testing contact electrodes for the SD metal layer through another one of the via-holes in the passivation layer, and the other one of the testing contact electrodes for the ITO electrode layer being connected to the source electrode of the first TFT and the source electrode of the second TFT.

The present disclosure further provides in some embodiments a method for testing the above-mentioned array substrate.

In an alternative embodiment, the testing method for the TEG in FIG. 4 may include the following steps.

Step S21: applying a scanning signal to the first testing contact electrode 203, enabling the second testing contact electrode 204 to be grounded, and applying a voltage to the sixth testing contact electrode 205 and the seventh testing contact electrode 206, so as to test performances of the first TFT 201 and the second TFT 202. To be specific, referring to FIG. 9, the scanning signal at a voltage within the range of from −20V to +20V may be applied to the first testing contact electrode 203 through a source/monitor unit (SMU, which is configured to provide and monitor a testing signal). Because no loop exists, the scanning signal may be maintained at the constant voltage without being divided. The second testing contact electrode 204 is grounded, so the sharing of the testing contact electrode may not be affected.

Figure 9:
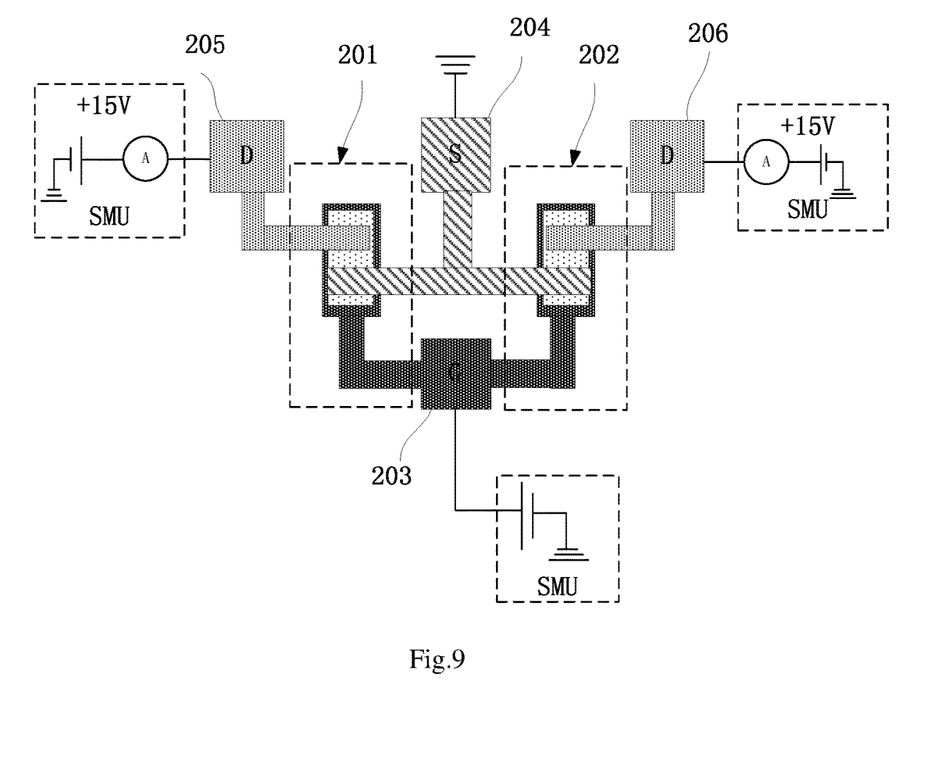
FIGS. 9-11 are schematic views showing a method for testing the TEG on the array substrate according to some embodiments of the present disclosure.

In the case of testing the first TFT 201, a voltage of +15V is applied to the sixth testing contact electrode 205 via a SMU. In the case of testing the second TFT 202, a voltage of +15V is applied to the seventh testing contact electrode 206 via a SMU.

Figure 10:
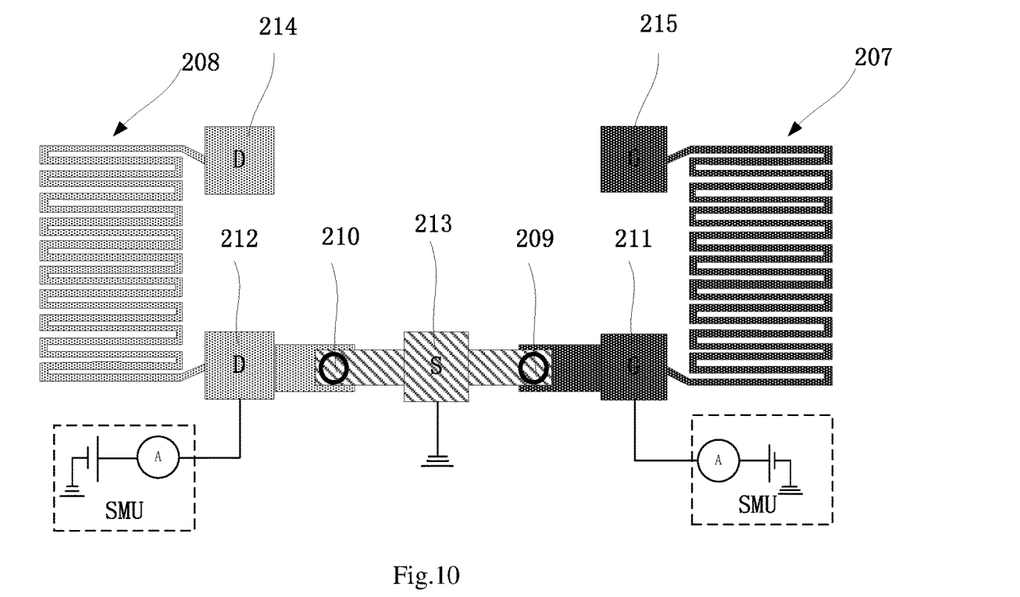

Step S22: enabling the fifth testing contact electrode 213 to be grounded, and applying a voltage to the third testing contact electrode 211 and the fourth testing contact electrode 212, so as to test the gate metal layer-ITO electrode contact resistor 209 and the SD metal layer-ITO electrode contact resistor 210. To be specific, referring to FIG. 10, in the case of testing the gate metal layer-ITO electrode contact resistor 209, a voltage is applied to the third testing contact electrode 211 via a SMU, and in the case of testing the SD metal layer-ITO electrode contact resistor 210, a voltage is applied to the fourth testing contact electrode 212 via a SMU.

Figure 11:
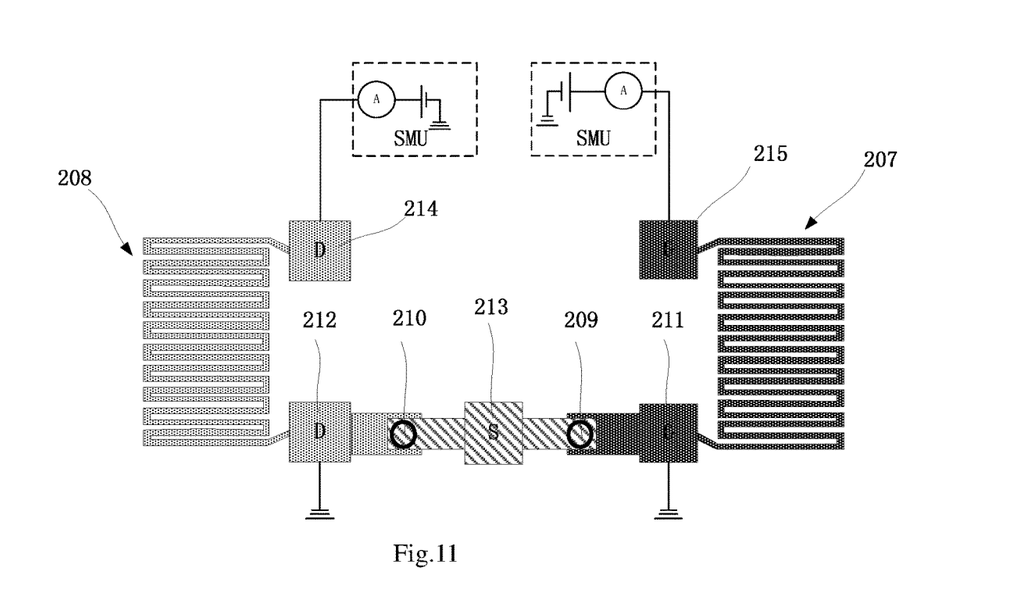

Step S23: enabling the third testing contact electrode 211 and the fourth testing contact electrode 212 to be grounded, and applying a voltage to the ninth testing contact electrode 215 and the eighth testing contact electrode 214, so as to test resistances of the gate metal line 207 and the SD metal line 208. To be specific, referring to FIG. 11, the third testing contact electrode 211 and the fourth testing contact electrode 212 connected to the ITO electrode layer are grounded. A voltage is applied to the eighth testing contact electrode 214 via a SMU so as to test the SD metal line 208, and a voltage is applied to the ninth testing contact electrode 215 via a SMU so as to test the gate metal line 207.

Alternatively, the nine testing contact electrodes may be arranged in a 3*3 array, with a row interval being identical to a column interval. The testing pins of the testing device may be arranged in a manner identical to the nine testing contact electrodes.

According to the embodiments of the present disclosure, it is able to test the first TFT, the second TFT, the resistance of the gate metal line, the resistance of the SD metal line, the gate metal layer-ITO electrode contact resistor and the SD metal layer-ITO electrode contact resistor using the testing pins once, thereby to reduce the tact time and improve the testing efficiency.

The above are merely the preferred embodiments of the present disclosure, but the present disclosure is not limited thereto. Obviously, a person skilled in the art may make further modifications and improvements without departing from the spirit of the present disclosure, and these modifications and improvements shall also fall within the scope of the present disclosure.

What is claimed is:

1. An array substrate, comprising a TEG arranged at a non-display area of the array substrate, wherein the TEG comprises a plurality of to-be-tested elements and a plurality of testing contact electrodes configured to test the to-be-tested elements, each of the to-be-tested elements is connected to at least two of the testing contact electrodes, and at least one of the testing contact electrodes is shared by at least two of the to-be-tested elements, wherein the to-be-tested elements comprise a gate metal line and a gate metal layer-ITO electrode contact resistor, and a third testing contact electrode is shared by the gate metal line and the gate metal layer-ITO electrode contact resistor; or the to-be-tested elements comprise a source-drain (SD) metal line and an SD metal layer-ITO electrode contact resistor, and a fourth testing contact electrode is shared by the SD metal line and the SD metal layer-ITO electrode contact resistor; or the to-be-tested elements comprise a gate metal layer-ITO electrode contact resistor and an SD metal layer-ITO electrode contact resistor, and a fifth testing contact electrode is shared by the gate metal layer-ITO electrode contact resistor and the SD metal layer-ITO electrode contact resistor.

2. The array substrate according to claim 1, wherein both the third testing contact electrode and the gate metal line are arranged at a same layer, and made of a same material.

3. The array substrate according to claim 1, wherein both the fourth testing contact electrode and the SD metal line are arranged at a same layer, and made of a same material.

4. The array substrate according to claim 1, wherein both the fifth testing contact electrode and an ITO electrode of the array substrate are arranged at a same layer, and made of a same material.

5. An array substrate, comprising a Testing Element Group (TEG) arranged at a non-display area of the array substrate, wherein the TEG comprises a plurality of to-be-tested elements and a plurality of testing contact electrodes configured to test the to-be-tested elements, each of the to-be-tested elements is connected to at least two of the testing contact electrodes, and at least one of the testing contact electrodes is shared by at least two of the to-be-tested elements, wherein the to-be-tested elements comprise a first TFT, a second TFT, a gate metal line, an SD metal line, a gate metal layer-ITO electrode contact resistor and an SD metal layer-ITO electrode contact resistor, and nine testing contact electrodes are used by the to-be-tested elements;

a first testing contact electrode is shared by a gate electrode of the first TFT and a gate electrode of the second TFT, a second testing contact electrode is shared by a source electrode of the first TFT and a source electrode of the second TFT, a third testing contact electrode is shared by the gate metal line and the gate metal layer-ITO electrode contact resistor, a fourth testing contact electrode is shared by the SD metal line and SD metal layer-ITO electrode contact resistor, and a fifth testing contact electrode is shared by the gate metal layer-ITO electrode contact resistor and the SD metal layer-ITO electrode contact resistor;

the gate electrode of the first TFT is connected to the first testing contact electrode, the source electrode of the first TFT is connected to the second testing contact electrode, and a drain electrode of the first TFT is connected to a sixth testing contact electrode;

the gate electrode of the second TFT is connected to the first testing contact electrode, the source electrode of the second TFT is connected to the second testing contact electrode, and a drain electrode of the second TFT is connected to a seventh testing contact electrode;

one end of the gate metal line is connected to the fourth testing contact electrode, and the other end of the gate metal line is connected to an eighth testing contact electrode;

one end of the SD metal line is connected to the third testing contact electrode, and the other end of the SD metal line is connected to a ninth testing contact electrode; and the gate metal layer-ITO electrode contact resistor is connected to the fifth testing contact electrode and the fourth testing contact electrode, and the SD metal layer-ITO electrode contact resistor is connected to the fifth testing contact electrode and the third testing contact electrode.

* * * * *